(12) United States Patent
Hirai et al.

(10) Patent No.: US 6,417,444 B1
(45) Date of Patent: *Jul. 9, 2002

(54) CF CARD CASING STRUCTURE

(75) Inventors: Yuji Hirai; Yutaka Ohtani, both of Tokyo (JP)

(73) Assignee: Honda Tsushin Kogyo Co, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,004

(22) Filed: Oct. 14, 1998

(30) Foreign Application Priority Data

Aug. 4, 1998 (JP) .......................... 10-220191

(51) Int. Cl.⁷ ................................ H05K 9/00
(52) U.S. Cl. .................... 174/35 R; 361/737; 361/759; 361/816
(58) Field of Search ................................ 361/737, 753, 361/816, 818, 759; 174/35 R, 52.1

(56) References Cited

U.S. PATENT DOCUMENTS

| | | | | |
|---|---|---|---|---|
| 5,053,613 A | * | 10/1991 | Onoda | 235/492 |
| 5,397,857 A | | 3/1995 | Farquhar et al. | 174/52.1 |
| 5,923,026 A | * | 7/1999 | Onoda | 235/492 |
| 5,926,374 A | * | 7/1999 | Onoda et al. | 361/737 |
| 6,166,913 A | * | 12/2000 | Fun et al. | 361/737 |

* cited by examiner

Primary Examiner—Dean A. Reichard
Assistant Examiner—Hung V Ngo
(74) Attorney, Agent, or Firm—Rader, Fishman & Grauer, PLLC

(57) ABSTRACT

A CF card casing structure includes at least a cover plate having a metal sheet surrounded by and fixed to an insert-molded frame, a counter cover plate of metal sheet and a receptacle connector. The insert-molded frame has catch slots made therein; and the counter cover plate has serrated latch pieces integrally connected thereto. Each latch piece is adapted to be inserted into a corresponding catch slot for detachably fastening the cover plate to the counter cover plate, thereby providing an integral assembly.

9 Claims, 5 Drawing Sheets

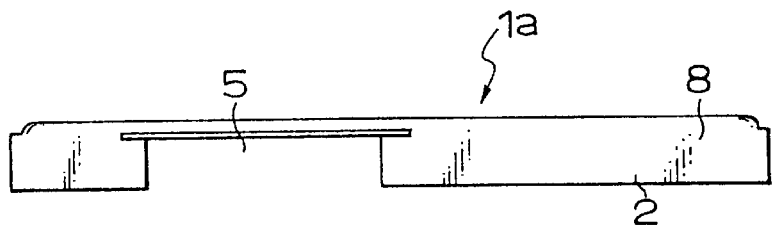
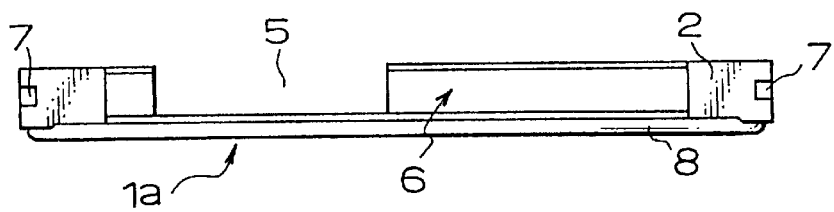
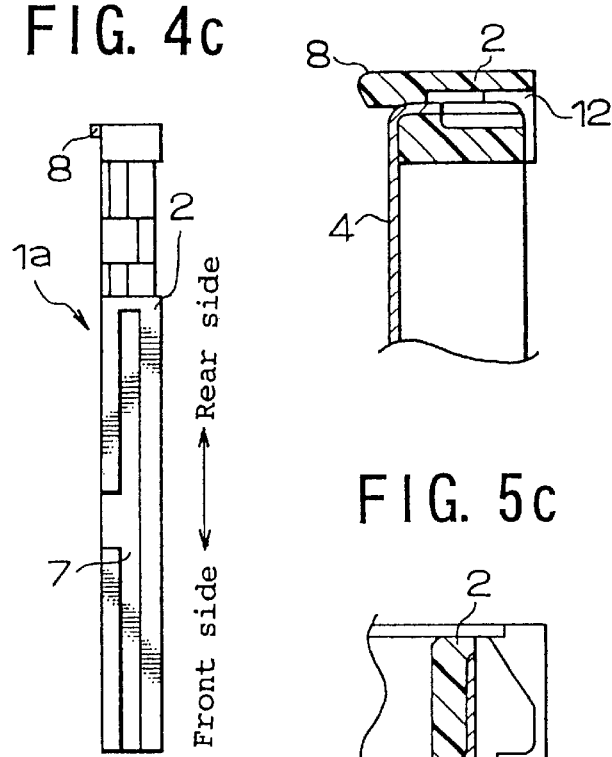
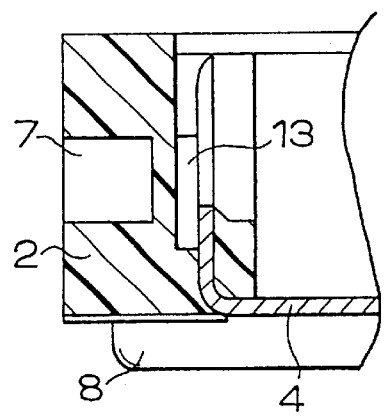
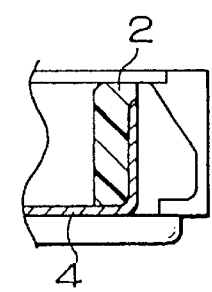
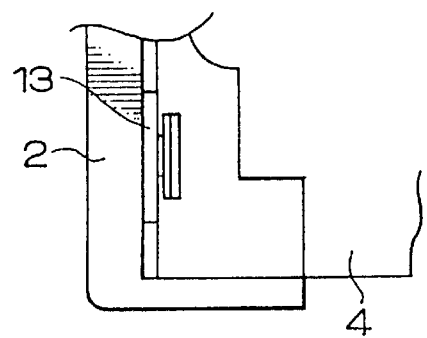

CF CARD CASING STRUCTURE

BACKGROUND OF THE INVENTION

1. Field of the Invention

The present invention relates to a casing structure for packaging a small-sized PC card, which is commonly called "Compact Flash Card" (hereinafter referred to as "CF card"), and is used in a mobile personal computer, portable telephone, digital camera and any surrounding electric/electronic device therefor.

2. Description of Related Art

A conventional CF card casing structure is disclosed in U.S. Pat. No. 5,397,857. Referring to FIG. 9, the conventional CF card casing structure comprises upper and lower insert-molded plates each having a metal sheet circumferentially embedded in its resin-molded frame. A chip-carrier substrate and an associated electric connector are sandwiched between the upper and lower insert-molded plates, and their resin-molded frames are super-sonic welded to form an integral package.

The upper and lower plates when subjected to the supersonic welding are liable to be deviated from their alignment position. The chip-carrier substrate has SMT leads soldered to its selected conductors, but such SMT leads when subjected to supersonic vibration are likely to come off. These will lead to poor yield of final products. The supersonic welding makes it difficult to take chip-carrier substrates off from defective packages for reuse. Even though the chip-carrier substrates are removed from such defective packages for reuse, the remaining casings cannot be reused, and therefore, new cover plates are required. The manufacturing cost of extra or additional cover plates is relatively high. Also disadvantageously, the chip-carrier substrates and I/O connectors when removed from the defective packages, are likely to be damaged more or less, and the cost involved for fixing such defective chip-carrier substrates for reuse is relatively high.

SUMMARY OF THE INVENTION

One object of the present invention is to provide an improved CF card casing structure which is free of such defects or problems as described above.

To attain this object a CF card casing structure comprising at least a cover plate having a metal sheet surrounded by and fixed to an insert-molded frame, a counter cover plate of metal sheet and a receptacle connector is improved according to the present invention in that: the insert-molded frame has a plurality of catch slots made therein; and the counter cover plate has a corresponding plurality of serrated latch pieces integrally connected thereto, each latch piece being adapted to be inserted into a corresponding catch slot for fastening the cover plate to the counter cover plate, thereby providing an integral assembly.

The fastening of the opposite (top and bottom) cover plates by inserting the serrated latch pieces of one of the opposite cover plates into the catch slots of the other assures that the opposite cover plates thus fastened are free of any deviation in alignment position, which would be caused for instance, in subjecting the top and bottom cover plates to the supersonic welding. Also, chip-carrier substrates and I/O connectors can be easily removed from defective packages without being damaged, leaving the cover plates free of any damages, too. Thus, such disassembled parts can be reused.

The cover plate and/or the counter cover plate may have an adhesive tape on its inside, the adhesive tape having adhesive partly applied to its carrier material, thereby permitting a sticky area to be left for fixing the receptacle connector, I/O connector and the like to selected areas of the cover plate by removing the carrier material. Thus, such parts can be fixedly attached to either cover plate with ease.

The opposite cover plates may be latched together to be mechanically and electrically connected, thus permitting the shielding of a chip-carrier PCB sandwiched therebetween.

The cover plate may have an insulating film applied to its inner metal surface, and likewise, the counter cover plate may have an insulating film applied to its inner metal surface, whereby the parts of the chip-carrier PCB sandwiched between the opposite cover plates may be protected from ESD voltage.

Other objects and advantages of the present invention will be understood from the following description of a CF card casing structure according to a preferred embodiment of the present invention, which is shown in accompanying drawings.

BRIEF DESCRIPTION OF THE DRAWINGS

FIGS. 4(a), (b) and (c) are rear, front and side views of the resin-framed metal cover plate of the CF card casing structure respectively;

FIGS. 5(a), (b), (c) and (d) are sectional views taken along the line 5a—5a, the line 5b—5b, and the line 5c—5c in FIG. 3, and FIG. 5(d) is an enlarged fragmental view of encircled portion "5d" in FIG. 3;

DESCRIPTION OF THE PREFERRED EMBODIMENTS

Figure 1:
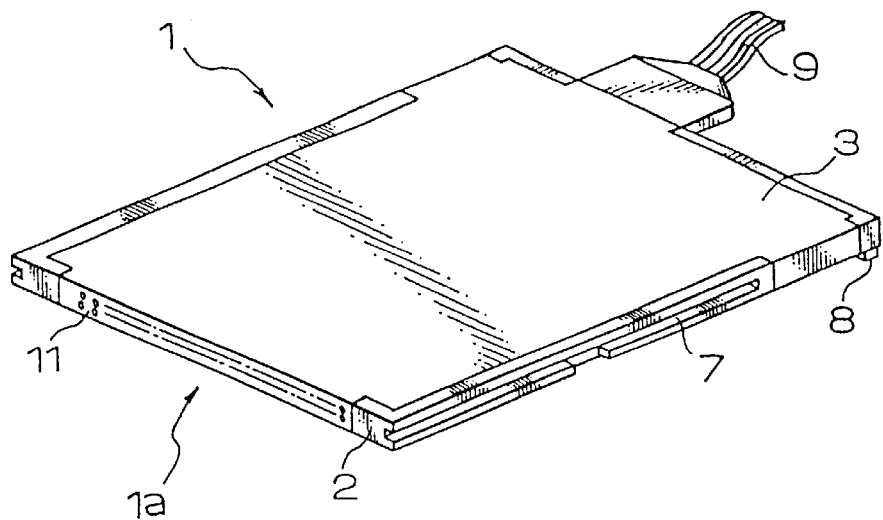
FIG. 1 is a perspective view of a CF card casing structure according to the present invention in the state of being used.
Figure 2A:
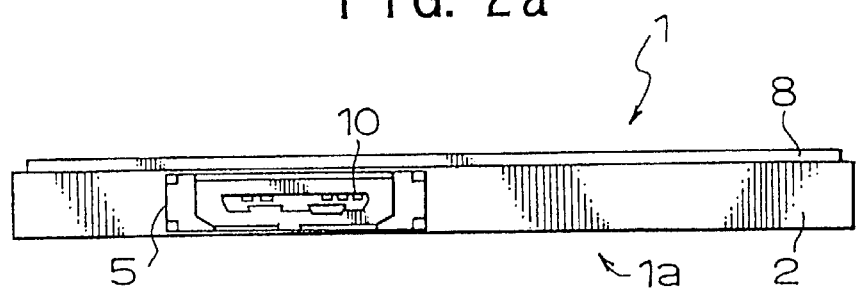
FIGS. 2(a), (b) and (c) are rear, side and front views of the CF card casing structure respectively.
Figure 2B:
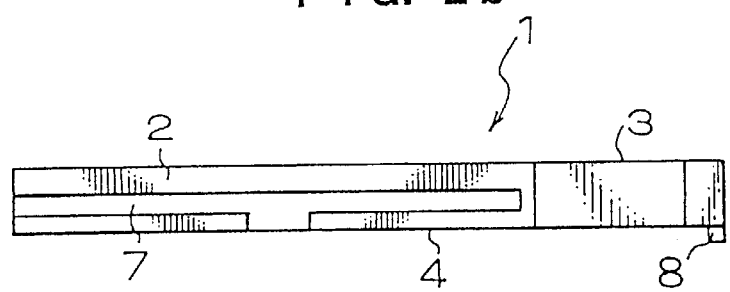
Figure 2C:
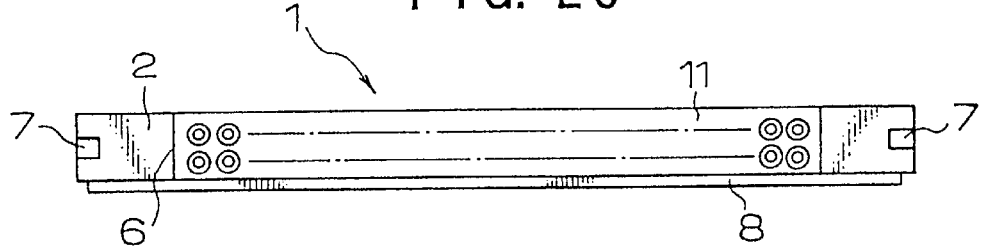

Referring to FIGS. 1 and 2, a CF card casing structure 1 comprises a cover plate (bottom cover) 1a having a metal sheet 4 surrounded by and fixed to an insert-molded frame 2 of a synthetic resin such as PPS, a counter cover plate (top cover) 3 of metal sheet such as stainless sheet and a receptacle connector 11 and a socket 10.

Figure 3A:
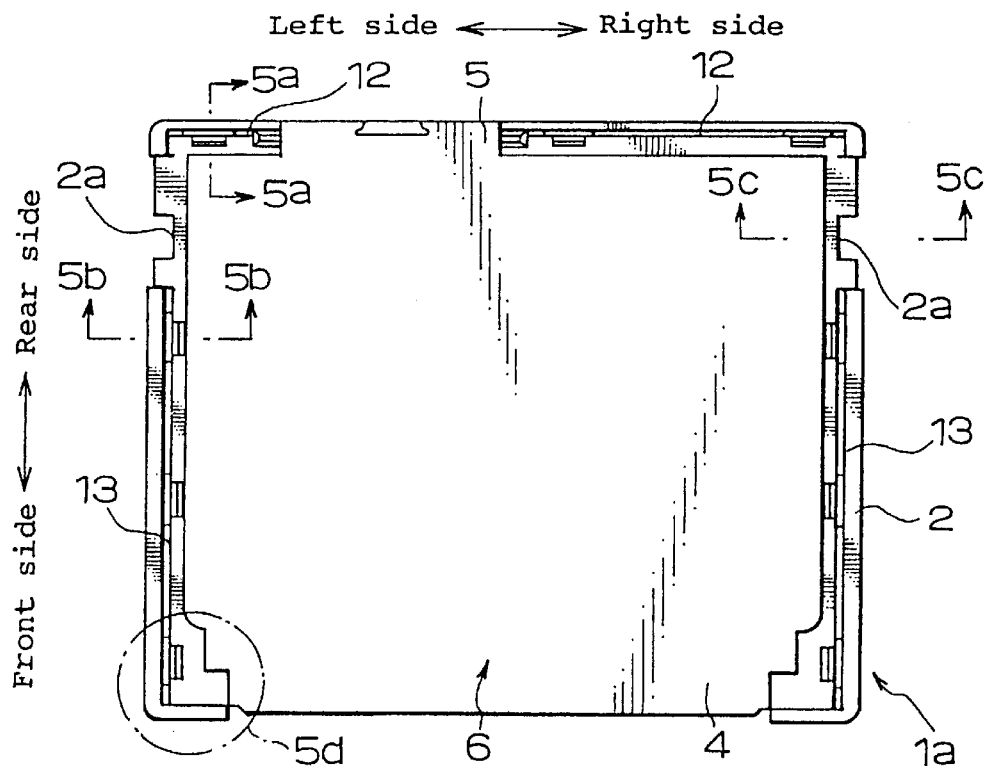
FIGS. 3(a) and (b) are plane views of the resin-framed metal cover plate of the CF card casing structure as seen from top and bottom sides respectively.
Figure 3B:
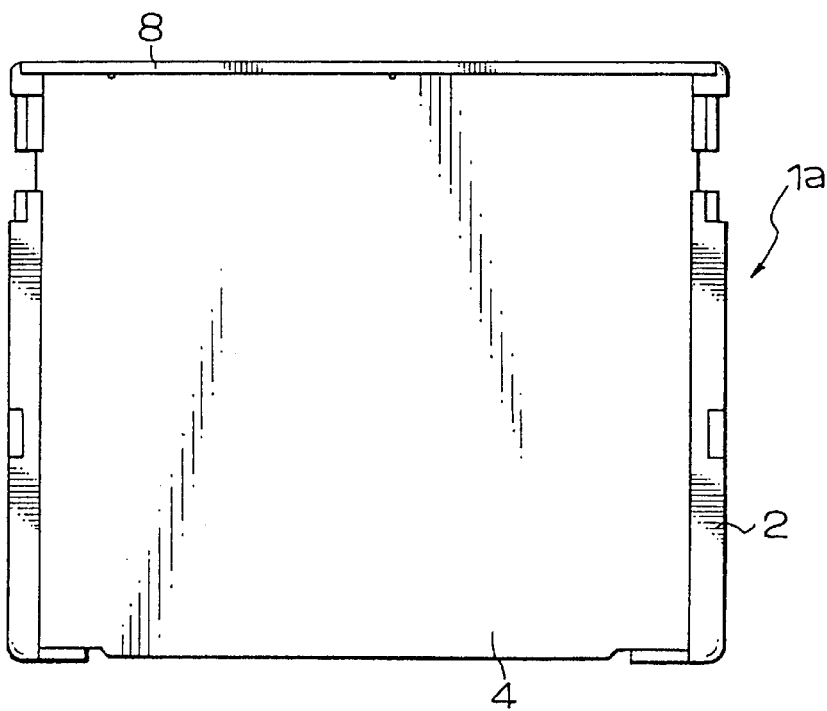

As seen from FIG. 3, the resin-framed metal cover plate 1a is like a rectangular box, and it is for instance, about 36 mm long, about 43 mm wide and about 3.3 mm thick.

As seen from FIG. 5, a metal sheet 4 is circumferentially embedded in a surrounding resin frame 2 in inject-molding, thus providing a resin-framed metal cover plate 1a.

The resin-molded frame 2 has an opening 5 made on its rear side (upper side in FIG. 3a) for accommodating the socket 10, which a cable adapter 9 can be applied to for connecting a mobile electronic device. Also, it has another opening 6 made on its front side (lower side in FIG. 3a) for accommodating the receptacle connector 11, which the pin-header of a CF card can be applied to.

The resin-molded frame 2 has guide slots 7 made on its opposite sides for insertion into an associated electric/electronic device. Also, it has a finger catch 8 projecting from its rear, lower edge for withdrawal from the associated electric/electronic device.

Figure 6:
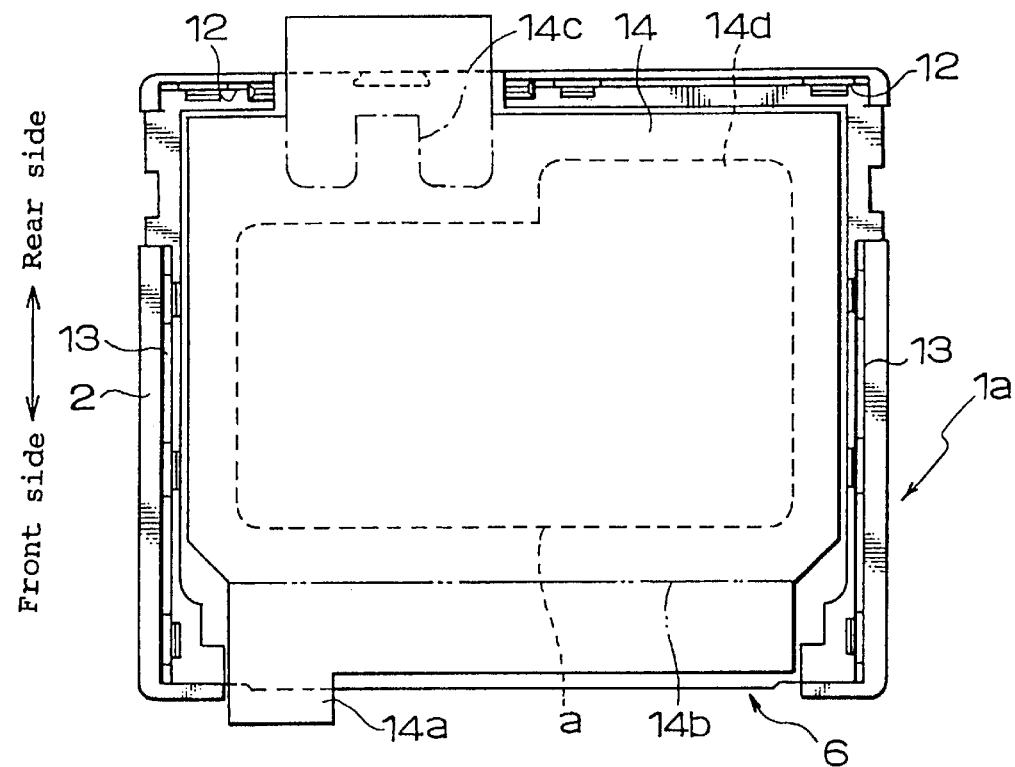
FIG. 6 is a plane view of the resin-framed metal cover plate with an adhesive tape applied to its metal sheet.

Referring to FIGS. 3 to 6, particularly FIG. 6, the resin-molded frame 2 has engagement slots 12 made lengthwise in the rear, lateral side and engagement slots 13 made lengthwise in the opposite, longitudinal sides. These engagement slots 12 and 13 are adapted to catch the counter projections of the cover plate (top cover) 3, as later described. Also, the resin-molded frame 2 has notches 2a made in the opposite, longitudinal sides. These notches 2a are adapted to catch the hook-like engagement projections of the top cover 3, as later described, too.

Referring to FIG. 6, a resin framed metal plate or bottom cover 1a has an insulating adhesive tape or sheet 14 applied to its inside. As shown in the drawing, the adhesive sheet 14 has a flap 14a extending from its front edge. The adhesive sheet 14 can be removed from the back of the bottom cover 1a along the broken lines "a" by pulling the flap 14a to leave the adhesive area delimited by the outer circumference and broken lines "a" of the adhesive sheet. The socket 10 and the receptacle connector 11 are fixed to the adhesive area thus exposed. The adhesive agent-free area 14d is defined inside the broken line "a".

Figure 7:
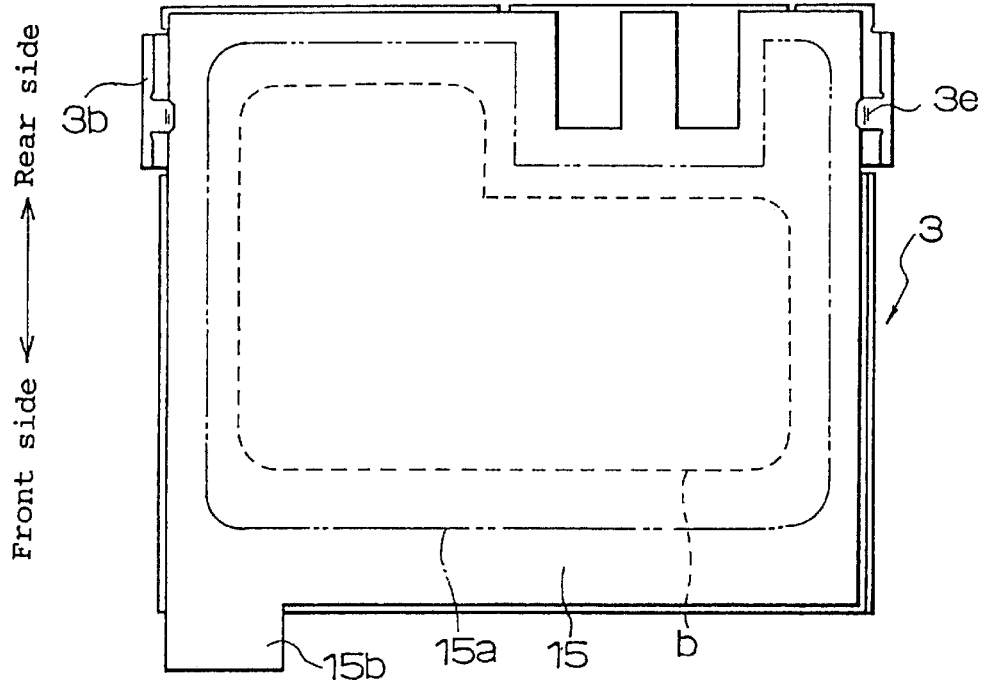
FIG. 7 is a plane view of the metal cover plate of the CF card casing structure.
Figure 8A:
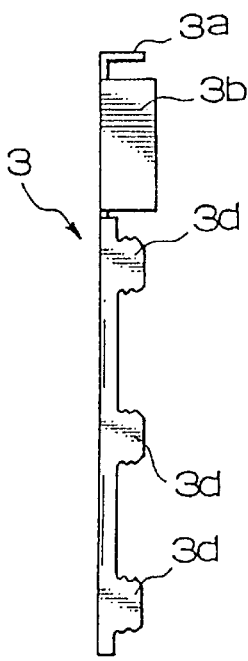
FIGS. 8(a) and (b) are side and rear views of the metal cover plate respectively.
Figure 8B:
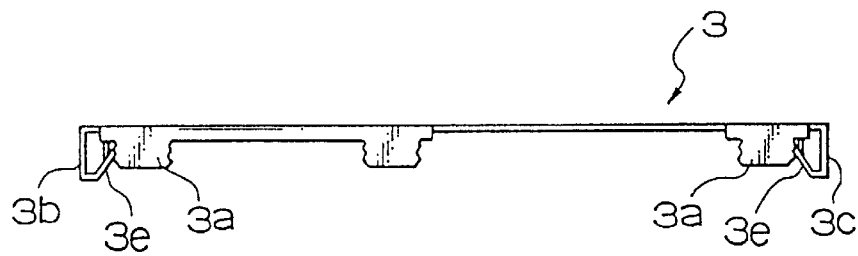
Figure 9:
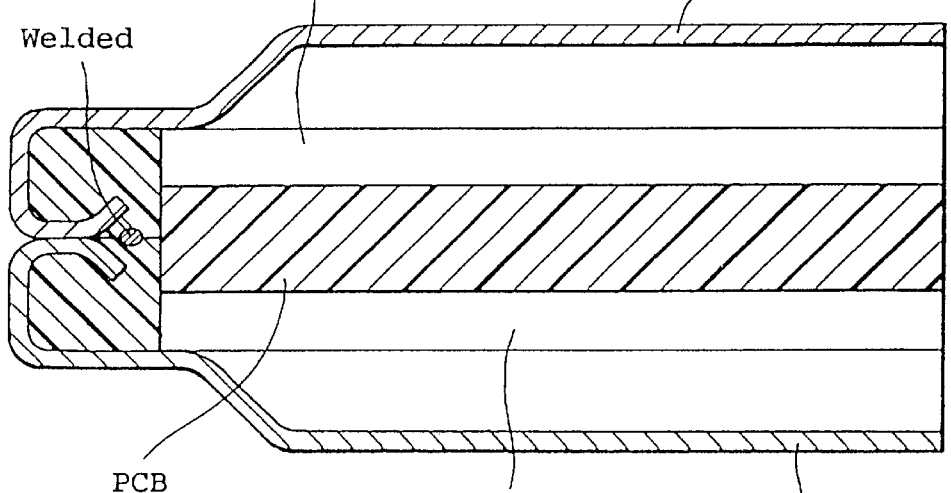
FIG. 9 is a sectional view of a fragment of a conventional CF card casing structure.

Referring to FIGS. 7 and 8, the top metal cover 3 has serrated latch pieces 3a and 3d integrally connected to and standing upright from its rear, lateral and opposite longitudinal sides, and hook-like engagement pieces 3b and 3c integrally connected to and standing upright from its opposite longitudinal sides.

The serrated latch pieces 3a and 3d are adapted to be caught by the catch slots whereas the hook-like engagement pieces 3b and 3c are adapted to be caught by the notches 2a of the bottom cover 1a. More specifically, when the top metal cover 3 is applied to the bottom framed-metal cover 1a, the serrated latch pieces 3a and 3d are pushed in the catch slots 13 to be caught thereby. The serration of each latch piece effectively prevents the slipping-off of the top cover 3 from the bottom cover 1a. When the top metal cover 3 is applied to the bottom framed-metal cover 1a, the hook-like engagement pieces 3b and 3c are pushed in the notched recesses 2a with their resilient hook ends 3e yieldingly bent inward, and then, the hook-like engagement pieces 3b and 3c are caught by the outer surface of the bottom cover 1a by allowing their resilient hook ends 3e to expand to their stress-free positions.

As seen from FIG. 7, the top metal cover 3 has an insulating adhesive sheet 15 applied to the whole inner surface thereof. As shown, the insulating adhesive sheet has perforation 15a made therein, and a flap 15b projecting from the metal cover 3. The area of the insulating adhesive sheet 15 which is delimited by the outer circumference and the perforation 15a can be removed by pulling the flap 15b to leave the adhesive area behind. The insulating adhesive sheet has no adhesive applied to its center area encircled by the broken line "b".

In assembling the top and bottom plates 3 and 1a, the receptacle connector 11 and the socket 10 into a card package 1, first, the insulating adhesive sheet 14 is partly removed along the perforation line "a" from the framed metal cover 1a to leave the center adhesive-free area on the bottom plate 1a (see FIG. 6), and then the receptacle connector 11 is put on the adhesive area thus exposed, and a printed circuit substrate is put on the center insulating area. The socket 10 is put on the rear side of the framed metal cover 1a.

Likewise, the insulating adhesive sheet 15 is partly removed from the top metal cover 3 along the perforation line 15a, and then the top metal cover 3 is applied to the bottom cover 1a with its serrated and hook-like engagement pieces 3a, 3d, and 3b, 3c caught by the catch slots 13 and notches 2a. Thus, the card package 1 is provided as shown in FIG. 1.

All parts are fixedly fastened in positions by means of latching means and by fixing the top and bottom covers in their adhesive circumferences. The chip-carrier PCB is pinched between the upper and lower insulating sheets of adhesive carrier material, and the top and bottom metal sheets are electrically connected by their hook-like engagement pieces 3b, 3c, thereby permitting the chip-carrier PCB and associated contacts to be grounded to the surrounding shield thus provided.

What is claimed is:

1. A CF card casing structure, comprising:
   a generally rectangularly-shaped frame fabricated from a molded material and defining a first facial surface, a second facial surface disposed opposite the first facial surface and a side end surface disposed between the first and second facial surfaces and extending peripherally about the frame, the side end surface including a plurality of notches formed therein, the first facial surface including a plurality of catch slots formed therein;
   a cover plate fabricated from metal sheet material and affixed to the frame at the second facial surface to form a CF card receiving compartment; and
   a counter cover plate fabricated from metal sheet material and having a flat cover portion, a plurality of serrated latch pieces and a plurality of hook pieces with the serrated latch pieces and the hook pieces being integrally formed with the cover portion and extending generally perpendicularly to the cover portion, the serrated latch pieces being oriented to correspond with respective ones of the catch slots and the hook pieces being oriented to correspond with respective ones of the notches,
   wherein, when the counter cover plate and the frame are connected together, the catch slots receive the serrated latch pieces and the notches receive the hook pieces with the received hook pieces being in contact with the cover plate.

2. A CF card casing structure according to claim 1, wherein the cover plate or the counter cover plate have an adhesive sheet on an inside surface thereof; the adhesive sheet having adhesive partly applied to its carrier material, thereby permitting a sticky area to be left for fixing the receptacle connector or an I/O connector by removing the carrier material.

3. A CF card casing structure according to claim 2 wherein the cover plate and the counter cover plate are latched together to be mechanically and electrically connected, thus permitting the shielding of the chip-carrier PCB sandwiched therebetween.

4. A CF card casing structure according to claim 2, 3 or 1 wherein the cover plate has an insulating film applied to its inner metal surface, and the counter cover plate has an insulating film applied to its inner metal surface, whereby the parts of the chip-carrier PCB sandwiched between the cover plate and the counter cover plate may be protected from ESD voltage.

5. A CF card casing structure according to claim 1, wherein each one of the hook pieces moves between a resiliently biased position and a stress-free position.

6. A CF card casing structure according to claim 5, wherein when each one of the hook pieces moves from the stress-free position to the resiliently biased position, the hook piece yieldingly bends inwardly and is resiliently biased outwardly toward the stress-free position.

7. A CF card casing structure according to claim 6, wherein respective ones of the notches are configured to catch the respective hook pieces in the stress-free position when the counter cover plate is connected to the frame.

8. A CF card casing structure according to claim 1, wherein the counter cover plate and the cover plate are electrically connected to each other by the hook pieces when the received hook pieces contact the cover plate.

9. A CF card casing structure according to claim 8, wherein the counter cover plate and the cover plate being electrically connected to each other to form an electrical shielding frame ground.

* * * * *